United States Patent
Katou et al.

(10) Patent No.: US 11,282,989 B2
(45) Date of Patent: Mar. 22, 2022

(54) LIGHT-EMITTING DEVICE AND ILLUMINATION APPARATUS

(71) Applicant: KYOCERA Corporation, Kyoto (JP)

(72) Inventors: Hidetaka Katou, Oumi-hachiman (JP); Tamio Kusano, Higashi-Oumi (JP); Kiyotaka Yokoi, Hikone (JP)

(73) Assignee: KYOCERA CORPORATION, Kyoto (JP)

( * ) Notice: Subject to any disclaimer, the term of this patent is extended or adjusted under 35 U.S.C. 154(b) by 30 days.

(21) Appl. No.: 16/650,995

(22) PCT Filed: May 10, 2018

(86) PCT No.: PCT/JP2018/018065
§ 371 (c)(1),
(2) Date: Mar. 26, 2020

(87) PCT Pub. No.: WO2019/064675
PCT Pub. Date: Apr. 4, 2019

(65) Prior Publication Data
US 2020/0279980 A1   Sep. 3, 2020

(30) Foreign Application Priority Data
Sep. 26, 2017   (JP) .............................. JP2017-184671

(51) Int. Cl.
*H01L 33/50* (2010.01)
*H01L 33/48* (2010.01)

(52) U.S. Cl.
CPC .......... *H01L 33/504* (2013.01); *H01L 33/486* (2013.01)

(58) Field of Classification Search
CPC ..... H01L 33/504; H01L 33/50; H01L 33/507; H01L 33/486; F21V 9/30;
(Continued)

(56) References Cited

U.S. PATENT DOCUMENTS

2009/0267484 A1   10/2009   Kasakura et al.
2014/0183578 A1   7/2014    Horie
(Continued)

FOREIGN PATENT DOCUMENTS

CN   206419744 U   8/2017
JP   2008-034833 A   2/2001
(Continued)

OTHER PUBLICATIONS

Machine translation of JP 2008-034833 A.*

*Primary Examiner* — Joseph L Williams
*Assistant Examiner* — Jose M Diaz
(74) *Attorney, Agent, or Firm* — Volpe Koenig

(57) ABSTRACT

A light-emitting device includes a light emitter including a light-emitting portion that emits first emission light having a first peak wavelength in a range of 380 to 425 nm and a half width of 15 to 35 nm, and a coating located over the light-emitting portion of the light emitter and containing phosphors to emit second emission light having a second peak wavelength in a range of 430 to 475 nm and having a third peak wavelength in a range of 490 to 540 nm. The light-emitting device emits external emission light having a peak region including the first peak wavelength, the second peak wavelength, and the third peak wavelength 14P02303 and having a long wavelength region defined between an upper end of the range of the third peak wavelength and a wavelength of 750 nm in which a light intensity decreases continuously.

10 Claims, 6 Drawing Sheets

(58) Field of Classification Search
CPC .. F21W 2131/308; F21S 4/28; F21Y 2115/10; F21K 9/64; A01K 63/06
See application file for complete search history.

(56) References Cited

U.S. PATENT DOCUMENTS

2014/0362885 A1   12/2014   Sakuta et al.
2017/0343168 A1   11/2017   Ting et al.

FOREIGN PATENT DOCUMENTS

| | | |
|---|---|---|
| JP | 2001-269104 A | 10/2001 |
| JP | 2010-199273 A | 9/2010 |
| JP | 2013-065555 A | 4/2013 |
| JP | 2013-229593 A | 11/2013 |
| JP | 2016-181550 A | 10/2016 |
| JP | 2017-034179 A | 2/2017 |

\* cited by examiner

LIGHT-EMITTING DEVICE AND ILLUMINATION APPARATUS

FIELD

The present invention relates to a light-emitting device including a light emitter and phosphors and to an illumination apparatus.

BACKGROUND

Recent light-emitting devices may use semiconductor light emitters such as laser-emitting diodes (LEDs) (hereafter, simply light emitters) as light sources, and recent illumination apparatuses may include such light-emitting devices mounted on substrates. These light-emitting devices or illumination apparatuses may be used in various manufacturing processes as an alternative to natural light, such as sunlight.

An attempt has focused on the use of such light-emitting devices for growing plants or raising animals, for example, for raising aquatic life indoors including cnidarian such as coral and actiniae, and aquatic animals such as fish. Light-emitting devices (lamps) have been developed for generating white light for this purpose, as one such example is described in Patent Literature 1 (JP2001-269104 A).

BRIEF SUMMARY

A light-emitting device according to an aspect of the present invention includes a light emitter including a light-emitting portion that emits first emission light having a first peak wavelength in a range of 380 to 425 nm and a half width of 15 to 35 nm, and a coating located over the light-emitting portion of the light emitter and containing phosphors to emit second emission light having a second peak wavelength in a range of 430 to 475 nm and having a third peak wavelength in a range of 490 to 540 nm. The light-emitting device emits external emission light having a peak region including the first peak wavelength, the second peak wavelength, and the third peak wavelength and having a long wavelength region defined between an upper end of the range of the third peak wavelength and a wavelength of 750 nm in which a light intensity decreases continuously.

An illumination apparatus according to another aspect of the present invention includes the light-emitting device according to the above aspect and a mounting board on which the light-emitting device is mounted.

DETAILED DESCRIPTION

A light-emitting device and an illumination apparatus according to embodiments of the present invention will now be described with reference to the accompanying drawings. The terms upper and lower herein are for descriptive purposes and do not intend to limit the directions in actual use of the light-emitting device and the illumination apparatus. The term being suitable for growing herein refers to allowing intended aquatic life to grow normally without dying or being damaged.

Figure 1:
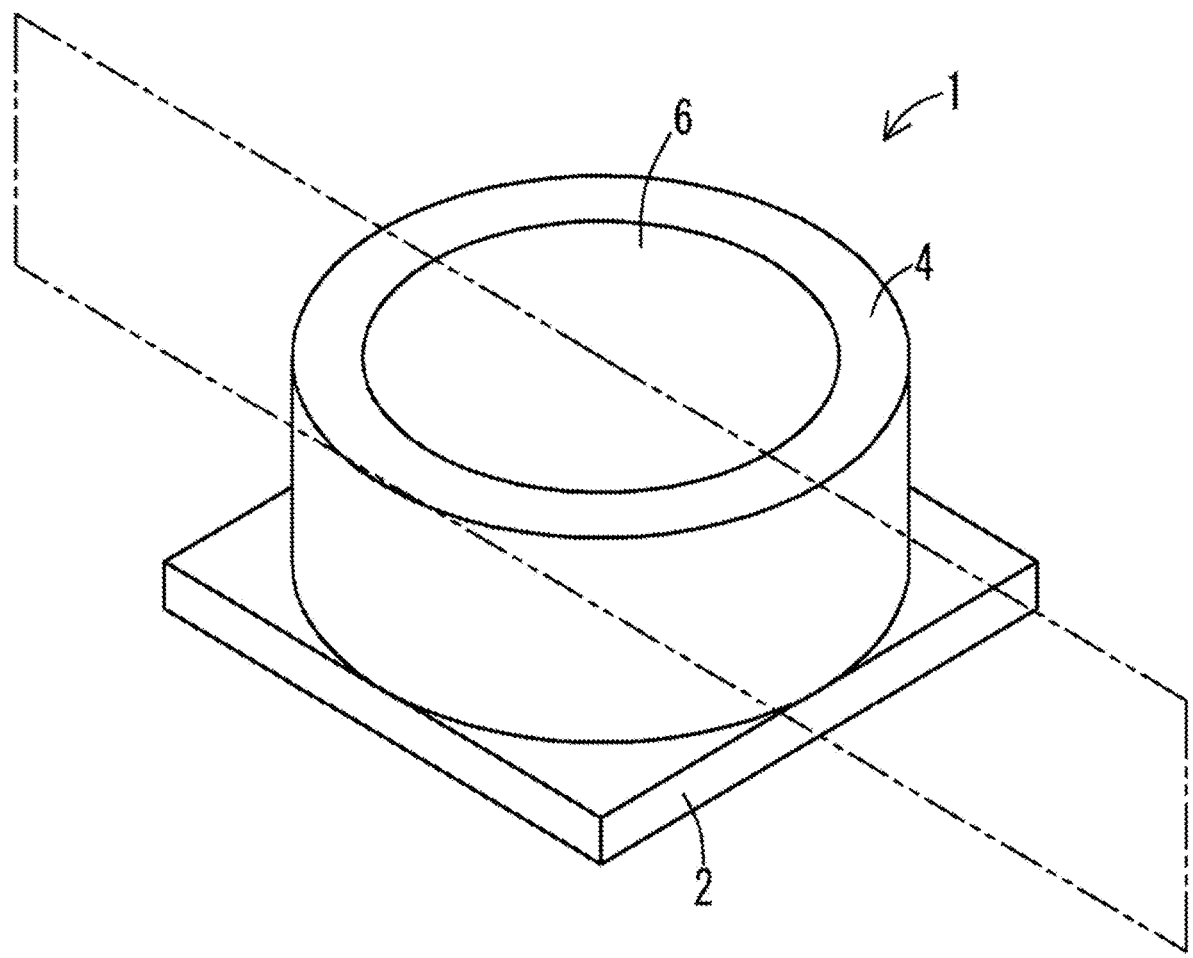
FIG. 1 is a perspective view of a light-emitting device according to an embodiment of the present invention.
Figure 2:
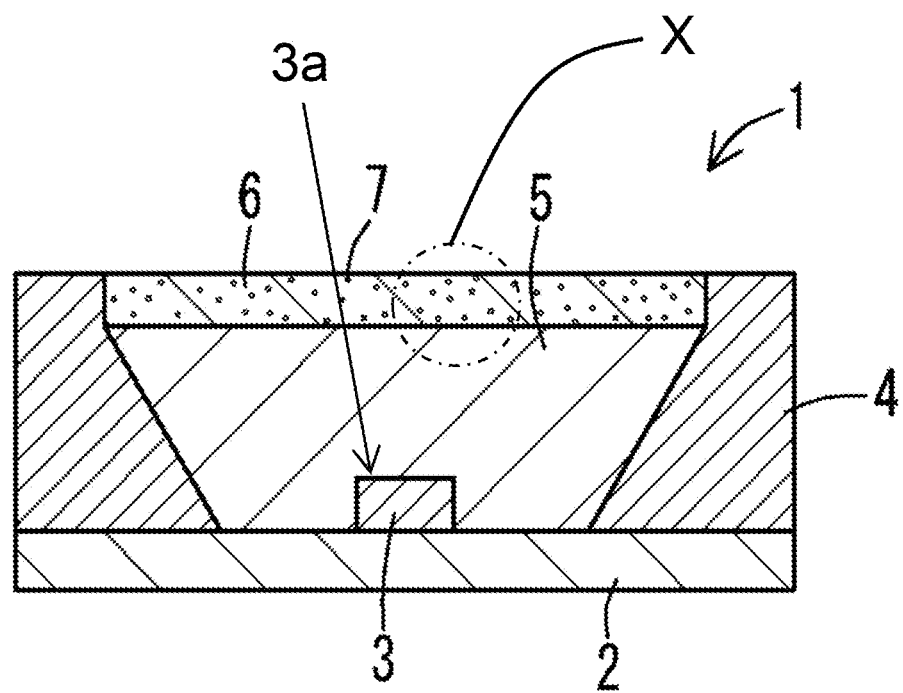
FIG. 2 is a cross-sectional view of the light-emitting device taken along a plane indicated by an imaginary line shown in FIG. 1.
Figure 3:
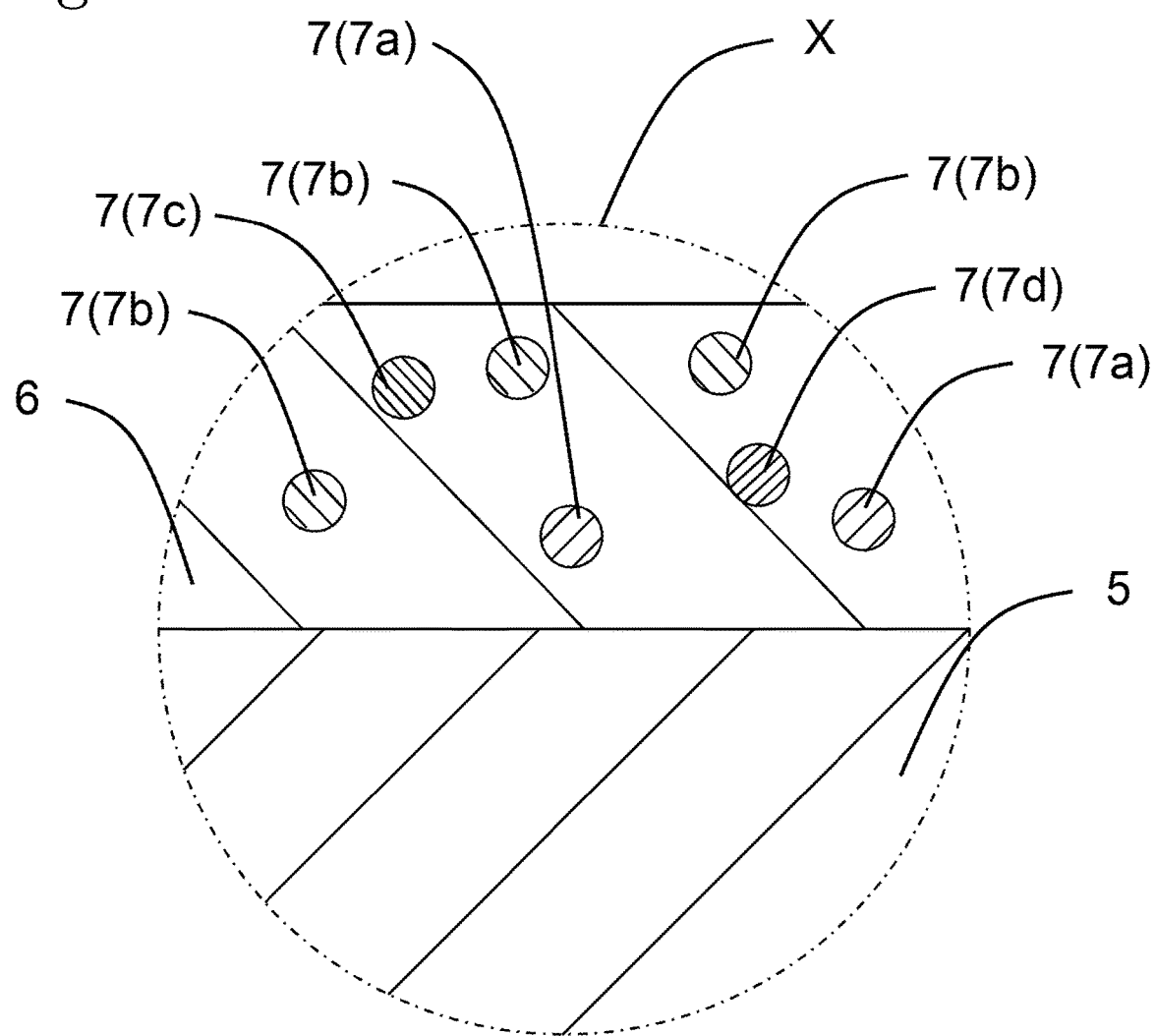
FIG. 3 is an enlarged cross-sectional view of a part of the light-emitting device shown in FIG. 2.
Figure 4:
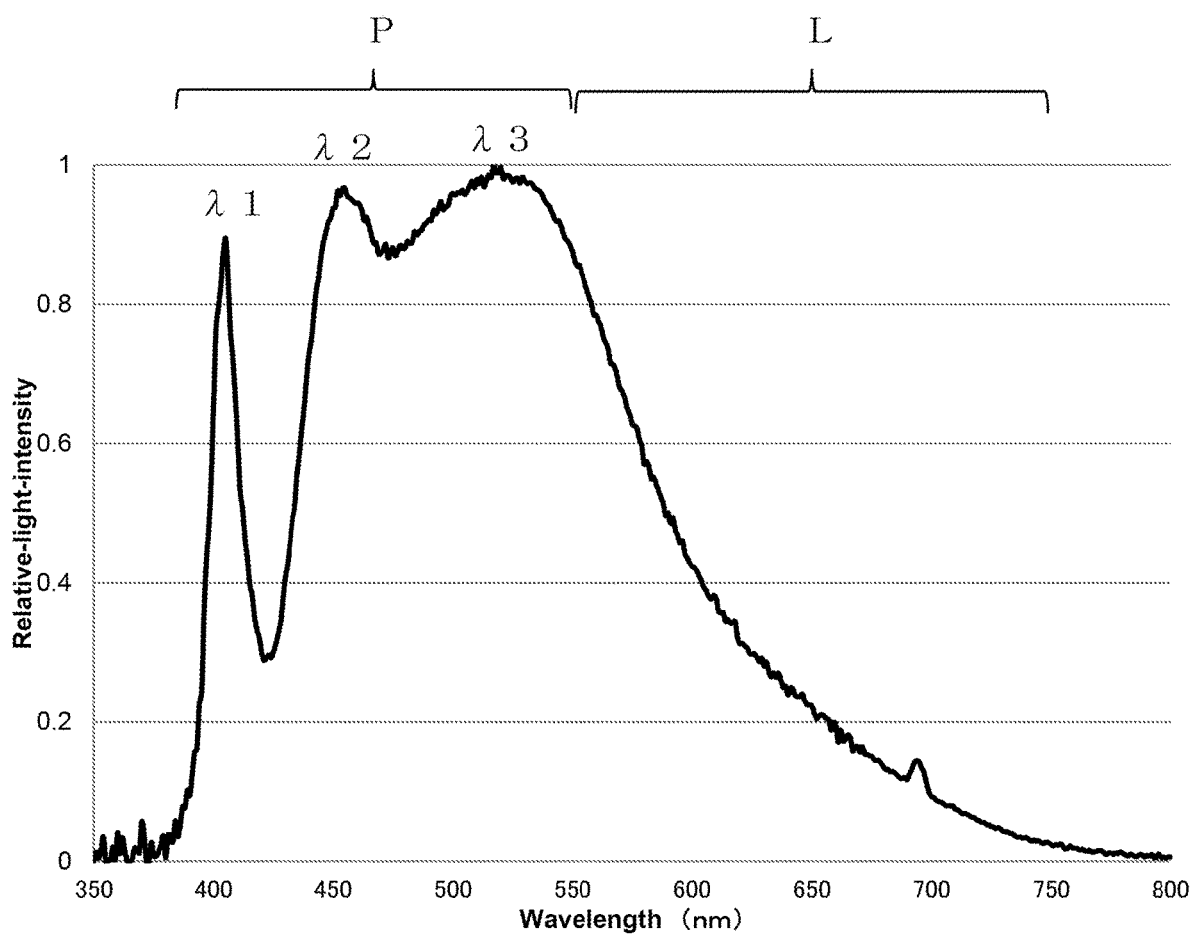
FIG. 4 is a graph showing the spectrum of external emission light from the light-emitting device according to the embodiment of the present invention.
Figure 5:
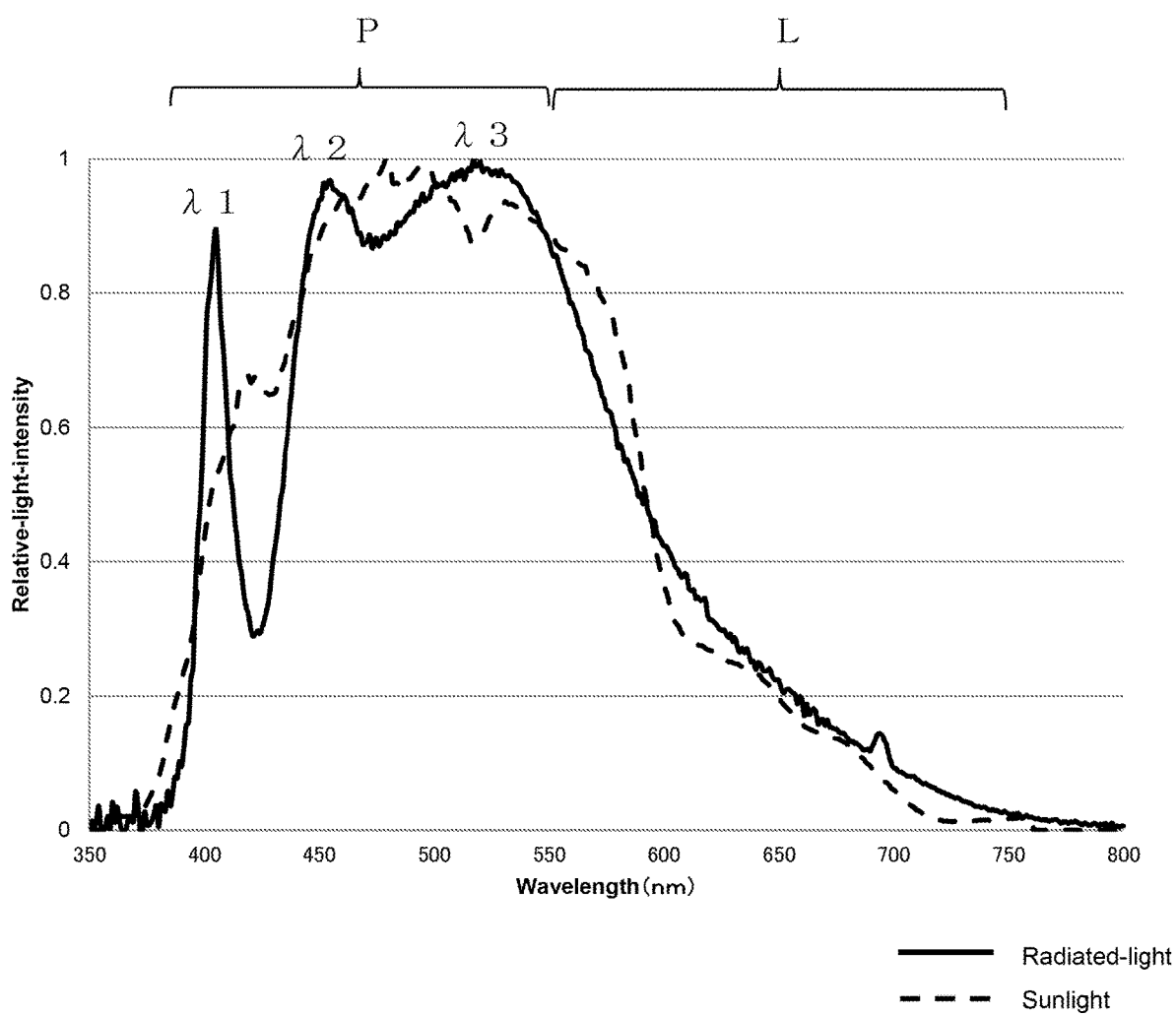
FIG. 5 is a graph showing the spectrum of sunlight in the sea, in addition to the spectrum shown in FIG. 4.
Figure 6:
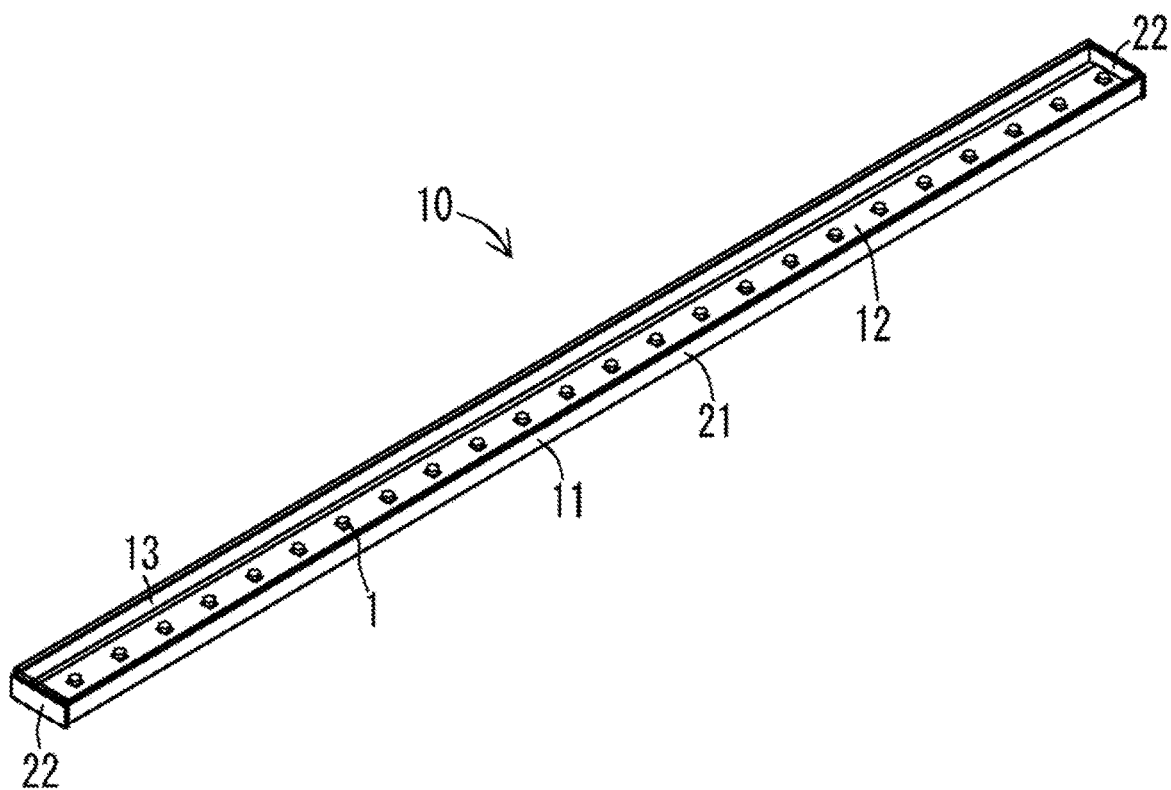
FIG. 6 is a perspective view of an illumination apparatus according to an embodiment of the present invention.

FIG. 1 is a perspective view of a light-emitting device 1 according to an embodiment of the present invention. FIG. 2 is a cross-sectional view of the light-emitting device 1 taken along a plane indicated by an imaginary line shown in FIG. 1. FIG. 3 is an enlarged cross-sectional view of a part of the light-emitting device 1 shown in FIG. 2. FIG. 4 is a graph showing the spectrum of external emission light from the light-emitting device according to the embodiment of the present invention. FIG. 5 is a graph showing the spectrum of sunlight in the sea, in addition to the spectrum shown in FIG. 4. FIG. 6 is a perspective view of an illumination apparatus 10 according to an embodiment of the present invention. As shown in these figures, the light-emitting device 1 includes a substrate 2, a light emitter 3, a frame 4, a sealant 5, a coating 6, and phosphors 7. The illumination apparatus 10 includes the light-emitting devices 1 and a mounting board 11 on which the light-emitting devices 1 are mounted.

In the present embodiment, the light-emitting device 1 includes the substrate 2, the light emitter 3 mounted on the substrate 2, the frame 4 located on an upper surface of the substrate 2 and surrounding the light emitter 3 in a plan view, the sealant 5 sealing the light emitter 3 within the frame 4, and the coating 6 located over the light emitter 3 with the sealant 5 between them. The coating 6 is located over a light-emitting portion 3a of the light emitter 3 and includes phosphors 7. The light emitter 3 is, for example, a light-emitting diode (LED), and emits light externally when electrons recombine with holes in the p-n junction in semiconductors.

The substrate 2 is, for example, a rectangular insulating substrate in a plan view and has a first surface on which the light emitter 3 is mounted (e.g., upper surface) and a second surface (e.g., lower surface) opposed to each other. The substrate 2 is formed from, for example, a ceramic material such as sintered aluminum oxide, sintered mullite, sintered aluminum nitride, or sintered silicon nitride, or sintered glass ceramic material. In some embodiments, the substrate 2 may be formed from a composite material containing two or more of these materials. In some embodiments, the substrate 2 may be formed from a polymeric resin containing particles (filler particles) of, for example, metal oxide in a dispersed manner. The filler particles can adjust the thermal expansion coefficient in the substrate 2.

The substrate 2 formed from, for example, sintered aluminum oxide may be prepared through the processes described below. Raw material powders such as aluminum oxide and silicon oxide are first mixed with an organic solvent and a binder, and the mixture is then kneaded to prepare slurry. The slurry is then shaped into a sheet with a method using, for example, a doctor blade, to obtain a ceramic green sheet. The ceramic green sheet is then cut into a predetermined shape and a predetermined size to obtain multiple sheets. The sheets are stacked on one another as appropriate and collectively fired at temperatures of about 1300 to 1600° C. The above processes complete the fabrication of the substrate 2.

The substrate 2 has, at least on its upper surface or inside, a wiring conductor (not shown). The wiring conductor 2 provides electrical connection inside and outside a part of the substrate 2 surrounded by the frame 4. The wiring conductor is formed from, for example, a conductive material selected appropriately from tungsten, molybdenum, manganese, copper, silver, palladium, and gold.

For the substrate 2 formed from a ceramic material, the wiring conductor may be prepared as described below. A metal paste prepared by mixing powder of, for example, tungsten with an organic solvent is printed onto multiple sheets to be the substrate 2 in a predetermined pattern. The multiple sheets are then stacked on one another and co-fired with the metal paste. The above processes complete the wiring conductor either on or inside the substrate 2. The surface of the wiring conductor is plated with, for example, nickel or gold, for reducing oxidation or for improving wettability or other properties with a brazing material (described later).

The surface of the substrate 2 on which the light emitter 3 is mounted (e.g., upper surface) may be coated with a metallic reflective layer (not shown) spaced from the wiring conductor and the plating layer to efficiently reflect light upward (outward) from the substrate 2. The metallic reflective layer is formed from, for example, a metal material such as aluminum, silver, gold, copper, or platina. The metal material may be formed into a metallization layer similarly to the wiring conductor or into a thin layer, such as a plated layer. The metallic reflective layer may also include different forms of metal layers.

The light emitter 3 is mounted on the upper surface of the substrate 2. The light emitter 3 is electrically and mechanically connected to the wiring conductor (or to the plating layer on it) on the upper surface of the substrate 2 with, for example, a brazing material or solder. The light emitter 3 includes a translucent base (with no labels) and the light-emitting portion 3a, which is an optical semiconductor layer located on the translucent base. The translucent base allows the optical semiconductor layer to be deposited by chemical vapor deposition, such as metal organic chemical vapor deposition or molecular beam epitaxy. The translucent base may be formed from, for example, sapphire, gallium nitride, aluminum nitride, zinc oxide, zinc selenide, silicon carbide, silicon, or zirconium boride. The translucent base has a thickness of, for example, 50 to 1000 µm inclusive.

The optical semiconductor layer includes a first semiconductor layer on the translucent base, a light-emitting layer on the first semiconductor layer, and a second semiconductor layer on the light-emitting layer. The first semiconductor layer, the light-emitting layer, and the second semiconductor layer are formed from, for example, a group III nitride semiconductor, a group III-V semiconductor such as gallium phosphide or gallium arsenide, or a group III nitride semiconductor such as gallium nitride, aluminum nitride, or indium nitride. The first semiconductor layer has a thickness of, for example, 1 to 5 µm inclusive. The light-emitting layer has a thickness of, for example, 25 to 150 nm inclusive. The second semiconductor layer has a thickness of, for example, 50 to 600 nm inclusive. The light emitter 3 formed in this manner may emit excitation light with a wavelength range of, for example, 380 to 425 nm inclusive. More specifically, the light-emitting device 1 according to the embodiment emits light in the violet wavelength region (visible light).

The frame 4 is formed from, for example, a ceramic material such as aluminum oxide, titanium oxide, zirconium oxide, or yttrium oxide. The frame 4 may be formed from a porous material. The frame 4 may be formed from a resin material containing a mixture of powders of, for example, metal oxide such as aluminum oxide, titanium oxide, zirconium oxide, or yttrium oxide.

The frame 4 is bonded to the upper surface of the substrate 2 with, for example, a resin, a brazing material, or solder. The frame 4 is located on the upper surface of the substrate 2 to be spaced from and surround the light emitter 3. The frame 4 has an inner sloping wall that flares away from the upper surface of the substrate 2. This sloping inner wall of the frame 4 that flares away serves as a reflection surface for externally reflecting excitation light emitted from the light emitter 3. When the inner wall of the frame 4 is circular as viewed from above, the reflection surface can uniformly reflect light emitted from the light emitter 3 externally.

The sloping inner wall of the frame 4 may include, for example, a metal layer of tungsten, molybdenum, or manganese on the inner periphery of the frame 4 formed from a sintered material, and a plating layer of nickel or gold covering the metal layer. The plating layer reflects light emitted from the light emitter 3. The inner wall of the frame 4 may have a slope angle (an angle between the inner wall of the frame and the upper surface of the substrate 2 in a sectional view) of, for example, 55 to 70° inclusive with respect to the upper surface of the substrate 2.

The inner space defined by the substrate 2 and the frame 4 is filled with the sealant 5, which transmits light. The sealant 5, which seals the light emitter 3, receives light emitted from inside the light emitter 3. Further, the sealant 5 can transmit the light received from the light emitter 3.

The sealant 5 fills the inner space defined by the substrate 2 and the frame 4 except an area of the inner space defined by the frame 4. The sealant 5 may be, for example, a translucent insulating resin such as a silicone resin, an acrylic resin, or an epoxy resin, or translucent glass. The sealant 5 has a refractive index of, for example, 1.4 to 1.6 inclusive.

The coating 6 is located over the light-emitting portion 3a of the light emitter 3. More specifically, the coating 6 faces the upper surface of the light emitter 3 with the sealant 5 between them. As shown in FIG. 2, for example, the coating 6 is placed on the upper surface of the sealant 5 in the upper area of the inner space defined by the substrate 2 and the frame 4. The coating 6 is fitted inside the frame 4. The coating 6 converts the wavelength of light emitted from the light emitter 3. The coating 6 converts the wavelength using the phosphors 7 contained in the coating 6.

More specifically, the coating 6 receives light emitted from the light emitter 3 through the sealant 5. The light emitted from the light emitter 3 and incident on the coating 6 excites the phosphors 7 in the coating 6, which then emit fluorescence. The coating 6 also transmits part of the light emitted from the light emitter 3. More specifically, external emission light through the coating 6 includes light emitted from the light emitter (first emission light) and fluorescence emitted from the phosphors 7 (second emission light). The spectrum of the external emission light combines the spectra of the first emission light and the second emission light.

The coating 6 is formed from, for example, a translucent insulating resin such as a fluororesin, a silicone resin, an acrylic resin, or an epoxy resin, or translucent glass. The insulating resin or the glass contains the phosphors 7. The phosphors 7 are uniformly dispersed in the coating 6.

The light emitter 3 and the phosphors 7 contained in the coating 6 are selected to allow the resulting light-emitting device 1 to externally emit light (external emission light) with the emission spectrum shown in FIG. 4 or 5. In this case, the light emitter 3 emitting the first emission light may also be selected to have external emission light with the above spectrum. The above emission spectrum is measurable with, for example, various commercially available measuring instruments including a spectrometer and a control circuit.

In the light-emitting device 1 according to the present embodiment, the light emitter 3 emits the first emission light having a first peak wavelength λ1 in a range of 380 to 425 nm as described above. The first emission light has a half width of 15 to 35 nm. The half width is the width of the wavelength ranging between the peak light intensity and the light intensity half the peak (the point indicated by 0.5 on the vertical axis in FIGS. 4 and 5). In the example shown in FIG. 4, the half width at half maximum is about 20 nm. In other words, the light emitter 3 has a sharp peak in the violet wavelength region.

The phosphors 7 contained in the coating 6 located over the light-emitting portion 3a of the light emitter 3 emit the second emission light having a second peak wavelength λ2 in a range of 430 to 475 nm and a third peak wavelength λ3 in a range of 490 to 540 nm. More specifically, the phosphors 7 are located to receive illumination with the first emission light emitted upward from the light-emitting portion 3a. As described above, the phosphors 7 illuminated with the first emission light emit fluorescence (the second emission light).

The external emission light from the light-emitting device 1 has a peak region P including the first peak wavelength λ1, the second peak wavelength λ2, and the third peak wavelength λ3 and has a long wavelength region L defined between the upper end of the range of the third peak wavelength λ3 and a wavelength of 750 nm (a wavelength substantially at the upper end of the visible light region), in which the light intensity decreases continuously. Light intensity ($W/m^2/nm$) refers to the irradiance of light per unit area and per unit wavelength.

More specifically, the light-emitting device 1 according to the embodiment emits external emission light having a spectrum with a peak in the violet region, which includes shorter wavelengths, and with peaks in the blue region and in the yellow region. The spectrum has the light intensity gradually decreasing toward and across the red region. The external emission light has a spectrum similar to, for example, the spectrum of sunlight, which reaches a depth of several meters (e.g., 2 to 15 m) in the sea. The light is suitable for growing aquatic life including aquatic animals, such as coral.

In the example shown in FIG. 3, the phosphors 7 include two different types of phosphors, or specifically, a first phosphor 7a and a second phosphor 7b. The first phosphor 7a emits fluorescence corresponding to the above second peak wavelength λ2. The second phosphor 7b emits fluorescence corresponding to the above third peak wavelength λ3. The phosphors 7 may include more than two different types of phosphors.

Specific examples of the phosphors 7 include the following. The first phosphor 7a that shows blue is $(Sr, Ca, Ba)_{10}(PO_4)_6C_{12}:Eu$. The second phosphor 7b that shows blue-green is $Sr_4Al_{14}O_{25}:Eu$. The ratio of the elements in the parentheses may be changed as appropriate without deviating from the molecular formulas.

The phosphors other than the first phosphor 7a and the second phosphor 7b may be a third phosphor 7c and a fourth phosphor 7d described below. The third phosphor 7c that shows yellow is $SrS_{i2}(O, Cl)_2N_2:Eu$. The fourth phosphor 7d that shows red is $CaAlSi(ON)_3:Eu$. The phosphors 7 including the third phosphor 7c and the fourth phosphor 7d, in addition to the first phosphor 7a and the second phosphor 7b, allow easy fabrication of the light-emitting device 1 that emits external emission light having the peak region P and the long wavelength region L described above. In this case, the mass of the phosphors 7 contained in the coating 6 may be greater in the order of the first phosphor 7a, the second phosphor 7b, the third phosphor 7c, and the fourth phosphor 7d. The specific mass of each type of phosphors 7 may be changed appropriately in accordance with conditions such as the material and thickness of the coating 6 or the emission spectrum of the light-emitting device 1.

In the light-emitting device 1 according to the embodiment, the light intensity between the first peak wavelength λ1 and the second peak wavelength λ2 (hereafter, the peak-to-peak intensity) may constitute 20 to 70% of the maximum light intensity (hereafter, maximum intensity) at the first peak wavelength λ1, the second peak wavelength λ2, and the third peak wavelength λ3. When the peak-to-peak intensity constitutes 20% or more of the maximum intensity, the peak-to-peak intensity (the light intensity between violet and blue) can effectively retain the intensity suitable for growing aquatic life (in particular, coral). When the peak-to-peak intensity constitutes 70% or less of the maximum intensity, the peak-to-peak intensity (the light intensity between violet and blue) can be appropriately reduced, lowering the likelihood of inhibiting the growth of aquatic life. In the example shown in FIG. 4, the peak-to-peak intensity is about 0.3 with respect to the maximum intensity defined as 1.

The light intensity of external emission light in the long wavelength region L may distribute in the manner described below. The light intensity of external light emission in the long wavelength region L may constitute 75 to 85% of the light intensity at the third peak wavelength λ3 in a wavelength region of 550 to 570 nm, 55 to 65% of the light intensity at the third peak wavelength λ3 in a wavelength region of 565 to 585 nm, 35 to 45% of the light intensity at the third peak wavelength λ3 in a wavelength region of 600 to 640 nm, 15 to 25% of the light intensity at the third peak wavelength λ3 in a wavelength region of 650 to 670 nm, and 5 to 15% of the light intensity at the third peak wavelength λ3 in a wavelength region of 690 to 710 nm. When the above conditions are satisfied, the attenuation (decrease) of the light intensity from a shorter wavelength to a longer wavelength in the long wavelength region L can effectively simulate that of sunlight as shown in FIG. 5. In other words, the attenuation of the light intensity at longer wavelengths can gradually slope less from the yellow region toward and across the red region as shown in FIG. 4. The external emission light may thus include light components in these regions in a balanced manner.

The above intensity relative to the light intensity (e.g., 75 to 85%) in each wavelength region (e.g., 550 to 570 nm) may be the maximum relative intensity (e.g., 85%) at the lower end (e.g., 550 nm) of the wavelength region and the minimum relative intensity (e.g., 75%) at the upper end (e.g., 570 nm) of the wavelength region. The light-emitting device 1 with this structure may emit light having light intensity attenuating more at longer wavelengths.

The light-emitting device 1 that emits the above external emission light may be fabricated with, for example, the same phosphors 7 as described above (the first phosphor 7a and the second phosphor 7b).

In this case as well, the mass of the phosphors 7 contained in the coating 6 may be greater in the order of the first phosphor 7a, the second phosphor 7b, the third phosphor 7c, and the fourth phosphor 7d.

The light-emitting device 1 according to the embodiment may emit external emission light with the light energy (J) in the wavelength region of 380 to 425 nm constituting 10 to 15% (hereafter, the first ratio) of the entire light energy across an all-wavelength region defined between the lower end of the range of the first peak wavelength λ1 and the upper end of the long wavelength region. In this case, the light energy at the shorter wavelengths (400 to 500 nm) is relatively small with respect to the entire light energy. This allows the external emission light to effectively simulate sunlight as shown in FIG. 5. The light-emitting device 1 can thus have external emission light suitable for growing aquatic life (in particular, coral living in the shallow sea).

In FIGS. 4 and 5, the light energy (J) in the above wavelength regions is represented by the area defined between a curve indicating the light intensity and a straight line indicating the relative intensity equal to zero (in other words, represented as an integrated or integral value of the light intensity per unit wavelength). The first peak wavelength λ1 is 380 nm at the lower end of its range. The long wavelength region has the upper end at about 750 nm. The above all-wavelength region thus substantially corresponds to the wavelength region of visible light. More specifically, the ratio of the light energy (J) in the above wavelength region of 380 to 425 nm indicates the ratio of the light energy in the region with relatively shorter wavelengths with respect to the light energy of visible light emitted from the light-emitting device 1.

The light-emitting device 1 according to the embodiments may emit external emission light with the light energy in the wavelength region of 430 to 475 nm constituting 20 to 30% (hereafter, the second ratio) of the entire light energy of the external emission light across the all-wavelength region. In this case, the light energy in the shorter wavelength region (400 to 500 nm) including the second peak wavelength λ2 is relatively small with respect to the entire light energy. This also allows the external emission light to effectively simulate sunlight as shown in FIG. 5. The light-emitting device 1 can thus have external emission light suitable for growing aquatic life (in particular, coral living in the shallow sea).

The light-emitting device 1 with the second ratio may further have the first ratio described above. The light-emitting device 1 with both the first and second ratios can have a spectrum more similar to the spectrum of sunlight in, for example, the shallow sea. In this case, the light-emitting device 1 with the second ratio may have a value slightly deviating from the value of the first ratio (e.g., deviating from a predetermined value by several percent).

The light-emitting device 1 according to the embodiments may emit external emission light with the light energy in the wavelength region of 475 to 750 nm constituting 60 to 70% (hereafter, the third ratio) of the entire light energy across the all-wavelength region. In this case, the light energy in the wavelength region from the third peak wavelength λ3 to and including the long wavelength region L is relatively large with respect to the entire light energy. The attenuation (decrease) of the light energy in the long wavelength region is smaller than in the peak region P, thus easily retaining relatively large light energy toward and across the red region. This also allows the external emission light to effectively simulate sunlight as shown in FIG. 5. The light-emitting device 1 can thus have external emission light suitable for growing aquatic life (in particular, coral living in the shallow sea).

The light-emitting device 1 with the third ratio may further have at least the first ratio or the second ratio described above. The light-emitting device with at least the first ratio or the second ratio in addition to the third ratio may have a spectrum more similar to sunlight in, for example, the shallow sea. In this case, the light-emitting device 1 with the third ratio may have a value slightly deviating from the value of at least the first ratio or the second ratio (e.g., deviating from a predetermined value by several percent).

The light-emitting device 1 satisfying all the first to third ratios described above emits light having a spectrum effectively similar to that of sunlight in the shallow sea. The light-emitting device 1 allows easier fabrication of an illumination apparatus (described in detail later) that can be effectively used for raising aquatic life.

The light-emitting device 1 satisfying all the first to third ratios may be fabricated with, for example, the same phosphors as the first phosphor 7a, the second phosphor 7b, the third phosphor 7c, and the fourth phosphor 7d in the coating 6 described above. In this case, the mass of the phosphors 7 may also be greater in the order of the first phosphor 7a, the second phosphor 7b, the third phosphor 7c, and the fourth phosphor 7d as in the above embodiment.

FIG. 6 shows the illumination apparatus 10 according to an embodiment of the present invention. The illumination apparatus 10 according to the embodiment includes light-emitting devices 1 with any of the structures described above mounted on a mounting board 11. In the example shown in FIG. 6, the mounting board 11 includes a base 12 that is a rectangular plate and a translucent lid 13 located above the base 12 to seal the light-emitting devices. The illumination apparatus 10 according to the embodiment further includes a housing 21 having grooves to receive the mounting board 11 and a pair of end plates 22 closing the ends of, or specifically the shorter sides of the housing 21.

The illumination apparatus 10 basically emits external emission light having the same spectrum as external emission light from the light-emitting device 1. The external emission light from the illumination apparatus 10 thus has the same effect as the external emission light from the light-emitting device 1. The same spectrum as the spectrum of the external emission light from the light-emitting device 1 refers to the spectrum having a peak region P including the first peak wavelength λ1 in a range of 380 to 425 nm (with a half width of 15 to 35 nm), the second peak wavelength λ2 in a range of 430 to 475 nm, and the third peak wavelength λ3 in a range of 490 to 540 nm and having a long wavelength region L defined between the upper end of the range of the third peak wavelength λ3 and a wavelength of 750 nm, in which the light intensity decreases continuously.

More specifically, the illumination apparatus 10 that can be used for raising, for example, aquatic life, includes multiple light-emitting devices 1 mounted in a mounting space defined by the mounting board 11 including the translucent lid 13 and by the housing 21. The illumination apparatus 10 including the light-emitting devices 1 with the above structure is suitable for raising aquatic life.

The illumination apparatus 10 may include light-emitting devices (with no label) (hereafter, other light-emitting devices) that emit external emission light with a spectrum different from the spectrum of the light-emitting device 1 according to the embodiment. The other light-emitting devices may include multiple different light-emitting devices that each emit external emission light with a different spectrum.

In this case, external emission light from such different light-emitting devices may be combined to produce external emission light having a spectrum similar to the spectrum of the light-emitting device 1 according to the embodiment. This structure can effectively increase the light intensity of the external emission light from the illumination apparatus 10 having the same spectrum as the spectrum of the light-emitting device 1. This structure further allows precise adjustment of the spectrum of the external emission light from the illumination apparatus 10 by appropriately adjusting the emission intensity of each of the different light-emitting devices. Such precise adjustment includes changing the maximum peak wavelength in the range of the first (second or third) peak wavelength λ1 (λ2 or λ3) or changing the half width within the above ranges.

The mounting board 11 holds multiple light-emitting devices 1 that are aligned with one another. The mounting board 11 also dissipates heat generated from the light-emitting devices 1 outside. The mounting board 11 is formed from, for example, a metal material such as aluminum, copper, and stainless steel, an organic resin material, or a composite material including these materials.

The mounting board 11 according to the present embodiment is an elongated rectangle in a plan view with a longitudinal length of, for example, 100 to 2000 mm inclusive. As described above, the mounting board 11 includes the base 12 having a mount area on its upper surface, on which multiple light-emitting devices 1 are mounted, and the translucent lid 13 sealing the mount area. The mounting board 11 is received in the grooves on the housing 21. The two ends of the grooves are closed with the end plates 22 to secure the mounting board 11 and the multiple light-emitting devices 1 mounted on the mounting board 11 in the housing 21.

The base 12 may be, for example, a printed board such as a rigid printed board, a flexible printed board, or a rigid flexible printed board. The wiring pattern on the base 12 and the wiring conductor in the substrate 2 included in each light-emitting device 1 are electrically connected to each other with solder or conductive adhesive. An electric signal (current) from an external power source through the base 12 is transmitted to the light emitter 3 through the substrate 2. The light emitter 3 then emits light.

The lid 13 seals the light-emitting devices 1 and transmits the external emission light from the light-emitting devices 1 outside. The lid 13 is thus formed from a translucent material transmitting the external emission light. Examples of the translucent material include an acrylic resin and glass. The lid 13 is a rectangular plate (e.g., in the shape of an elongated rectangle similarly to the base 12) with a longitudinal length of, for example, 98 to 1998 mm inclusive.

The lid 13 is placed through either of the two open ends of the grooves on the housing 21 in the longitudinal direction, and is then slid in the longitudinal direction of the housing 21 for positioning. As described above, the two ends of the grooves are closed with the end plates 22 to secure the lid 13 to the housing 21. This completes the illumination apparatus 10 including the multiple light-emitting devices 1 mounted on the mounting board 11 and sealed with the housing 21 and the lid 13.

The lid 13 may be formed from a material that diffuses light. This allows the illumination apparatus 10 to reduce glare while having the external emission light with the same spectrum as the light-emitting device 1. Examples of a light diffusive material include the above translucent material mixed with particles of a resin material having a refractive index of light different from that of the translucent material.

The illumination apparatus 10 described above is a line emission apparatus including the multiple light-emitting devices 1 aligned linearly. In some embodiments, the illumination apparatus 10 may be a plane emission apparatus including multiple light-emitting devices 1 arranged in a matrix or in a staggered pattern. The mounting board 11 (or base 12) may not be an elongated rectangle in a plan view, and may be, for example, a square having a small aspect ratio, or in shapes other than a rectangle, such as a circle or an ellipse in a plan view. For example, to fit on an aquarium for raising aquatic life, the illumination apparatus may include the mounting board 11 having the same shape as the aquarium (e.g., circular).

Multiple illumination apparatuses each including the multiple light-emitting devices 1 mounted linearly on the mounting board 11 may be mounted on another substrate to form an illumination module used for raising aquatic life. The illumination apparatus 10 or the module described above may further include a sealant (not shown) at a predetermined position such as between the housing 21 and the lid 13 to reduce water entry affecting the apparatus or the module, or may further include a moisture absorbent placed in the housing. The wiring conductor may be plated with a plating layer such as a gold plating layer.

REFERENCE SIGNS LIST

1 light-emitting device
2 substrate
3 light emitter
3*a* light-emitting portion
4 frame
5 sealant
6 coating
7 phosphor
7*a* first phosphor
7*b* second phosphor
7*c* third phosphor
7*d* fourth phosphor
10 illumination apparatus
11 mounting board
12 base
13 lid
21 housing
22 end plate
P peak region
L long wavelength region

The invention claimed is:

1. A light-emitting device, comprising:
   a light emitter including a light-emitting portion configured to emit first emission light having a first peak wavelength in a range of 380 to 425 nm and a half width of 15 to 35 nm; and
   a coating located over the light-emitting portion of the light emitter, the coating containing phosphors to emit second emission light having a second peak wavelength in a range of 430 to 475 nm and having a third peak wavelength in a range of 490 to 540 nm,
   wherein the light-emitting device emits external emission light having a peak region including the first peak wavelength, the second peak wavelength, and the third peak wavelength and having a long wavelength region defined between an upper end of the range of the third peak wavelength and a wavelength of 750 nm in which a light intensity decreases continuously,
   wherein
   the external emission light has, in a wavelength region of 380 to 425 nm, light energy constituting 10 to 15% of entire light energy across an all-wavelength region defined between a lower end of the range of the first peak wavelength and an upper end of the long wavelength region.

2. The light-emitting device according to claim 1, wherein a light intensity between the first peak wavelength and the second peak wavelength constitutes 20 to 70% of a maximum light intensity at the first peak wavelength, the second peak wavelength, and the third peak wavelength.

3. The light-emitting device according to claim 1, wherein the external emission light has a light intensity in the long wavelength region constituting 75 to 85% of a light intensity at the third peak wavelength in a wavelength region of 550 to 570 nm, 55 to 65% of the light intensity at the third peak wavelength in a wavelength region of 565 to 585 nm, 35 to 45% of the light intensity at the third peak wavelength in a wavelength region of 600 to 640 nm, 15 to 25% of the light intensity at the third peak wavelength in a wavelength region of 650 to 670 nm, and 5 to 15% of the light intensity at the third peak wavelength in a wavelength region of 690 to 710 nm.

4. An illumination apparatus, comprising:
the light-emitting device according to claim 1; and
a mounting board on which the light-emitting device is mounted.

5. The light-emitting device according to claim 1, wherein the phosphors include more than two different types of phosphors, each having a different peak wavelength, and the phosphors contained in the coating, the more the peak wavelength is on the longer wavelength side, the smaller the mass of the phosphors contained in the coating is.

6. The light-emitting device according to claim 1, wherein the light intensity at the first peak wavelength is larger than the light intensity of the spectrum of sunlight, which reaches a depth of several meters in the sea at the same wavelength.

7. The light-emitting device according to claim 1, wherein the phosphor includes a yellow phosphor to emit yellow emission light having a peak wavelength in a yellow range of 570 to 590 nm and a red phosphor to emit red emission light having a peak wavelength in a red range of 610 to 670 nm, and
a slope of the attenuation of the light intensity in the red region is smaller than in the yellow region.

8. The light-emitting device according to claim 1, wherein the attenuation of the light intensity in the long wavelength region gradually slope less from the yellow region toward the red region.

9. A light-emitting device, comprising:
a light emitter including a light-emitting portion configured to emit first emission light having a first peak wavelength in a range of 380 to 425 nm and a half width of 15 to 35 nm; and
a coating located over the light-emitting portion of the light emitter, the coating containing phosphors to emit second emission light having a second peak wavelength in a range of 430 to 475 nm and having a third peak wavelength in a range of 490 to 540 nm,
wherein the light-emitting device emits external emission light having a peak region including the first peak wavelength, the second peak wavelength, and the third peak wavelength and having a long wavelength region defined between an upper end of the range of the third peak wavelength and a wavelength of 750 nm in which a light intensity decreases continuously,
wherein
the external emission light has, in a wavelength region of 430 to 475 nm, light energy constituting 20 to 30% of entire light energy across the all-wavelength region.

10. A light-emitting device, comprising:
a light emitter including a light-emitting portion configured to emit first emission light having a first peak wavelength in a range of 380 to 425 nm and a half width of 15 to 35 nm; and
a coating located over the light-emitting portion of the light emitter, the coating containing phosphors to emit second emission light having a second peak wavelength in a range of 430 to 475 nm and having a third peak wavelength in a range of 490 to 540 nm,
wherein the light-emitting device emits external emission light having a peak region including the first peak wavelength, the second peak wavelength, and the third peak wavelength and having a long wavelength region defined between an upper end of the range of the third peak wavelength and a wavelength of 750 nm in which a light intensity decreases continuously,
wherein
the external emission light has, in a wavelength region of 475 to 750 nm, light energy constituting 60 to 70% of entire light energy across the all-wavelength region.

* * * * *